(12) United States Patent
Park et al.

(10) Patent No.: US 9,443,607 B2
(45) Date of Patent: Sep. 13, 2016

(54) LATCH CIRCUIT AND SEMICONDUCTOR DEVICE INCLUDING THE SAME

(71) Applicant: SK hynix Inc., Icheon-si Gyeonggi-do (KR)

(72) Inventors: Jun Cheol Park, Icheon-si (KR); Sung Soo Chi, Yongin-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/522,046

(22) Filed: Oct. 23, 2014

(65) Prior Publication Data

US 2015/0380104 A1    Dec. 31, 2015

(30) Foreign Application Priority Data

Jun. 26, 2014   (KR) .......................... 10-2014-0078680

(51) Int. Cl.
*G11C 17/16* (2006.01)
*G11C 17/18* (2006.01)
*G11C 29/44* (2006.01)

(52) U.S. Cl.
CPC ............... *G11C 17/18* (2013.01); *G11C 17/16* (2013.01); *G11C 2029/4402* (2013.01)

(58) Field of Classification Search
CPC .............................. G11C 17/16; G11C 29/027
USPC ................................................. 365/225.7, 96
See application file for complete search history.

(56) References Cited

U.S. PATENT DOCUMENTS

| | | | | |
|---|---|---|---|---|
| 5,764,564 A | * | 6/1998 | Frake | G11C 11/412 365/154 |
| 6,205,064 B1 | * | 3/2001 | Ooishi | G11C 29/027 365/200 |
| 6,462,994 B2 | * | 10/2002 | Kim | G11C 29/804 365/200 |
| 6,788,596 B2 | | 9/2004 | Kim et al. | |
| 7,016,255 B2 | * | 3/2006 | Lee | G11C 7/1075 365/230.03 |
| 7,111,224 B1 | * | 9/2006 | Trimberger | G01R 31/318519 326/38 |
| 7,283,420 B2 | * | 10/2007 | Kim | G11C 8/16 365/189.04 |
| 7,324,389 B2 | * | 1/2008 | Cernea | G11C 29/846 365/189.05 |
| 7,889,831 B2 | * | 2/2011 | Mnich | G11C 29/802 377/54 |
| 7,894,281 B2 | | 2/2011 | Park | |
| 8,751,885 B2 | * | 6/2014 | You | G11C 29/4401 714/718 |
| 9,281,082 B1 | * | 3/2016 | Lee | G11C 29/765 |
| 9,336,839 B2 | * | 5/2016 | Jeong | G11C 7/106 |
| 9,337,813 B1 | * | 5/2016 | Lee | H03K 3/356104 |
| 2009/0285033 A1 | * | 11/2009 | Yamada | G11C 17/18 365/189.05 |
| 2015/0262635 A1 | * | 9/2015 | Joo | G11C 7/1087 365/72 |

* cited by examiner

*Primary Examiner* — Huan Hoang
*Assistant Examiner* — Roberto Mancera
(74) *Attorney, Agent, or Firm* — William Park & Associates Ltd.

(57) ABSTRACT

A latch circuit includes a write driving unit configured to output fuse data as boot-up data according to a fuse set select signal in a boot-up operation; and a latch set configured to latch the boot-up data when a latch select signal is activated in the boot-up operation, and output data latched as the latch select signal is activated as a repair column address in a normal operation.

16 Claims, 6 Drawing Sheets

LATCH CIRCUIT AND SEMICONDUCTOR DEVICE INCLUDING THE SAME

CROSS-REFERENCES TO RELATED APPLICATION

The present application claims priority under 35 U.S.C. §119(a) to Korean application number 10-2014-0078680, filed on Jun. 26, 2014, in the Korean Intellectual Property Office, which is incorporated herein by reference in its entirety.

BACKGROUND

1. Technical Field

Various embodiments generally relate to a latch circuit and a semiconductor device including the same, and more particularly, to a technology for increasing a net die.

2. Related Art

A laser fuse circuit has disadvantages. The area occupied by a fuse array is substantial, and, above all things, limitations exist in that programming is possible at only a wafer level and is impossible at a package level.

Recently, an E-fuse is replacing a laser fuse. The E-fuse is highlighted as an alternative for overcoming the disadvantages of the laser fuse as described above. The E-fuse basically has the type of a transistor and is programmed in such a way as to rupture a gate dielectric layer by applying a high electric field to a gate.

While an E-fuse circuit may be realized in various forms, an array E-fuse (ARE) circuit in which unit fuse cells are arranged in an array pattern is widely used. In general, the data programmed in the ARE circuit is read and stored in a register in the initializing (power-up) operation of a semiconductor integrated circuit. Then, a repair operation is performed using the data stored in the register.

The operation of storing the programmed ARE data in the register is referred to as boot-up. In the initializing operation, the boot-up operation is started using a reset signal which is inputted from an exterior.

In a conventional semiconductor memory device, a number fuse latches are arranged in an array structure to perform a repair operation. In this regard, since the fuse latches according to the conventional art have a fighting-free structure, the number of transistors increases. Further, the configuration of the conventional fuse latches is complicated because a path for storing information and a path for reading stored information are different from each other when performing the boot-up operation to store repair information in latches.

SUMMARY

In an embodiment, a latch circuit may include a write driving unit configured to output fuse data as boot-up data according to a fuse set select signal in a boot-up operation. The latch circuit may also include a latch set configured to latch the boot-up data when a latch select signal is activated in the boot-up operation, and output data latched as the latch select signal is activated as a repair column address in a normal operation.

In an embodiment, a semiconductor device may include an array E-fuse circuit configured to store repair information. The semiconductor device may also include a latch circuit configured to output fuse data applied from the array E-fuse circuit as boot-up data, according to a fuse set select signal, latch the boot-up data when a latch select signal is activated in a boot-up operation, and output data latched as the latch select signal is activated as a repair column address in a normal operation. Further, the semiconductor device may include a memory bank configured to replace a normal cell with a redundancy cell by using the repair column address.

DETAILED DESCRIPTION

Hereinafter, a latch circuit and a semiconductor device including the same will be described below with reference to the accompanying drawings through various examples of embodiments. Various embodiments are directed to realizing a path for storing information and a path for reading information in such a way as to be the same with each other, thereby simplifying a latch structure and improving net die efficiency.

Figure 1:
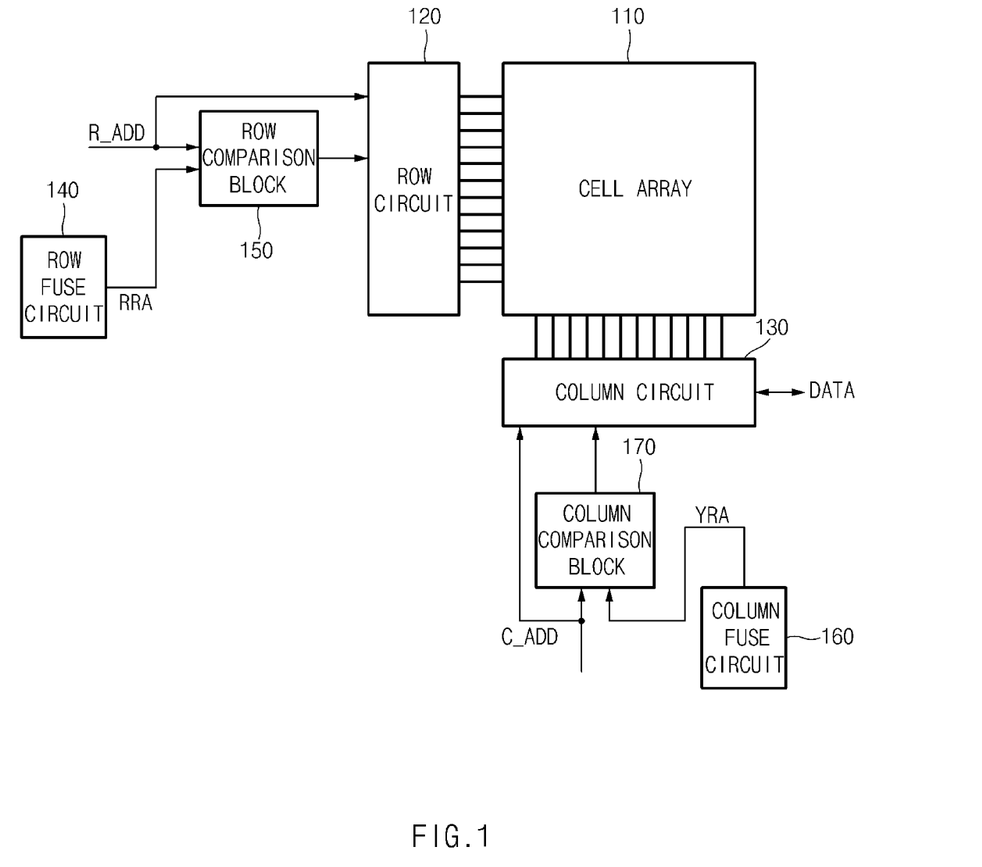
FIG. 1 is a representation of an example of a conceptual layout diagram to assist in the explanation of the repair operation of a memory device.

Referring to FIG. 1, a representation of an example of a conceptual layout diagram to assist in the explanation of the repair operation of a memory device is shown.

A memory device includes a cell array 110, a row circuit 120, a column circuit 130, a row fuse circuit 140, a row comparison block 150, a column fuse circuit 160, and a column comparison block 170.

The cell array 110 includes a plurality of memory cells. The row circuit 120 activates a word line selected by a row address R_ADD. The column circuit 130 accesses (reads or writes) the data of a bit line selected by a column address C_ADD.

The row fuse circuit 140 stores a row address corresponding to a failed memory cell in the cell array 110, as a repair row address RRA. The row comparison block 150 compares the repair row address RRA stored in the row fuse circuit 140 and the row address R_ADD inputted from an exterior of the memory device.

If the repair row address RRA and the row address R_ADD correspond to each other, the row comparison block 150 controls the row circuit 120 to activate a redundancy word line in place of a word line designated by the row address R_ADD.

The column fuse circuit 160 stores a column address corresponding to a failed memory cell in the cell array 110, as a repair column address YRA. The column comparison block 170 compares the repair column address YRA stored in the column fuse circuit 160 and the column address C_ADD inputted from an exterior of the memory device.

If the repair column address YRA and the column address C_ADD correspond to each other, the column comparison block 170 controls the column circuit 130 to access a redundancy bit line in place of a bit line designated by the column address C_ADD. Such fuse circuits 140 and 160 store repair information in array E-fuse (ARE) circuits by including the array E-fuse circuits in the memory device.

Figure 2:
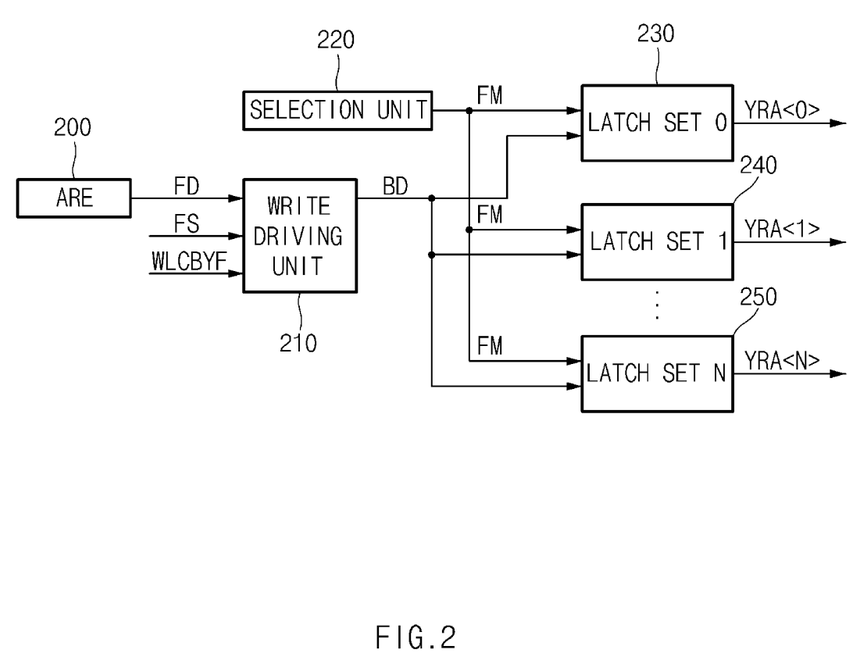
FIG. 2 is a configuration diagram illustrating a representation of an example of a latch circuit for storing repair information in accordance with an embodiment.

Referring to FIG. 2, a configuration diagram illustrating a representation of an example of a latch circuit to store repair information in accordance with an embodiment is shown.

A latch circuit includes an array E-fuse (ARE) circuit 200, a write driving unit 210, a selection unit 220, and a plurality of latch sets 230 to 250 to store the repair information of memory banks.

The latch circuit may correspond to each of the fuse circuits 140 and 160 of FIG. 1. Repair information corresponding to all memory banks and setting information necessary for operations of a memory device may be stored in the latch circuit. The latch circuit includes the array E-fuse circuit 200.

The selection unit 220 generates a latch select signal FM to select certain latches among the latches included in the plurality of latch sets 230 to 250. The selection unit 220 may generate a plurality of latch select signals FM<0:N>. By using a clock CLK, the selection unit 220 may sequentially activate the plurality of latch select signals FM<0:N> every time the clock CLK is activated.

For example, if the latch select signal FM<1> is activated in response to the activation of the clock CLK this time, the latch select signal FM<2> may be activated in response to the next activation of the clock CLK. Such a selection unit 220 may include N+1 number of flip-flop circuits.

The latch sets 230 to 250 store the repair information of the memory banks corresponding to them, in correspondence to the latch select signals FM. More specifically, the latch sets 230 to 250 may receive and store boot-up data BD when the latch select signals FM corresponding to them are activated.

Repair information to be stored in the latch sets 230 to 250 is transmitted from the array E-fuse circuit 200. The array E-fuse circuit 200 transmits the repair information stored to the latch sets 230 to 250 from the activation time of a boot-up signal.

Since the array E-fuse circuit 200 is configured in an array type, a predetermined time is required to call the data stored therein. Since immediate call of the data is impossible, it is impossible to perform a repair operation by directly using the data stored in the array E-fuse circuit 200.

Therefore, the repair information and the setting information stored in the array E-fuse circuit 200 are transmitted to and stored in the latch sets 230 to 250 accordingly. The data stored in the latch sets 230 to 250 are used in the repair operation of the memory banks.

The process in which the repair information stored in the array E-fuse circuit 200 is transmitted to the latch sets 230 to 250 is referred to as boot-up. If the boot-up operation is started, the boot-up data BD are sequentially transmitted to all the latch sets 230 to 250 through the write driving unit 210. Only when the boot-up operation is completed, the memory device may start a normal operation after repairing failed cells and performing various setting operations.

The write driving unit 210 selectively outputs the boot-up data BD to the latch sets 230 to 250 according to fuse data FD, a fuse set select signal FS and a reset signal WLCBYF. The write driving unit 210 stores the boot-up data BD in the latch sets 230 to 250 in the boot-up operation.

The fuse data FD represent fuse data applied from the array E-fuse circuit 200. The fuse set select signal FS is a signal to select at least any one of the plurality of latch sets 230 to 250. The reset signal WLCBYF is a signal to reset the output nodes of repair column addresses YRA. FIG. 2 illustrates repair column addresses YRA<0> to YRA<N>.

Figure 3:
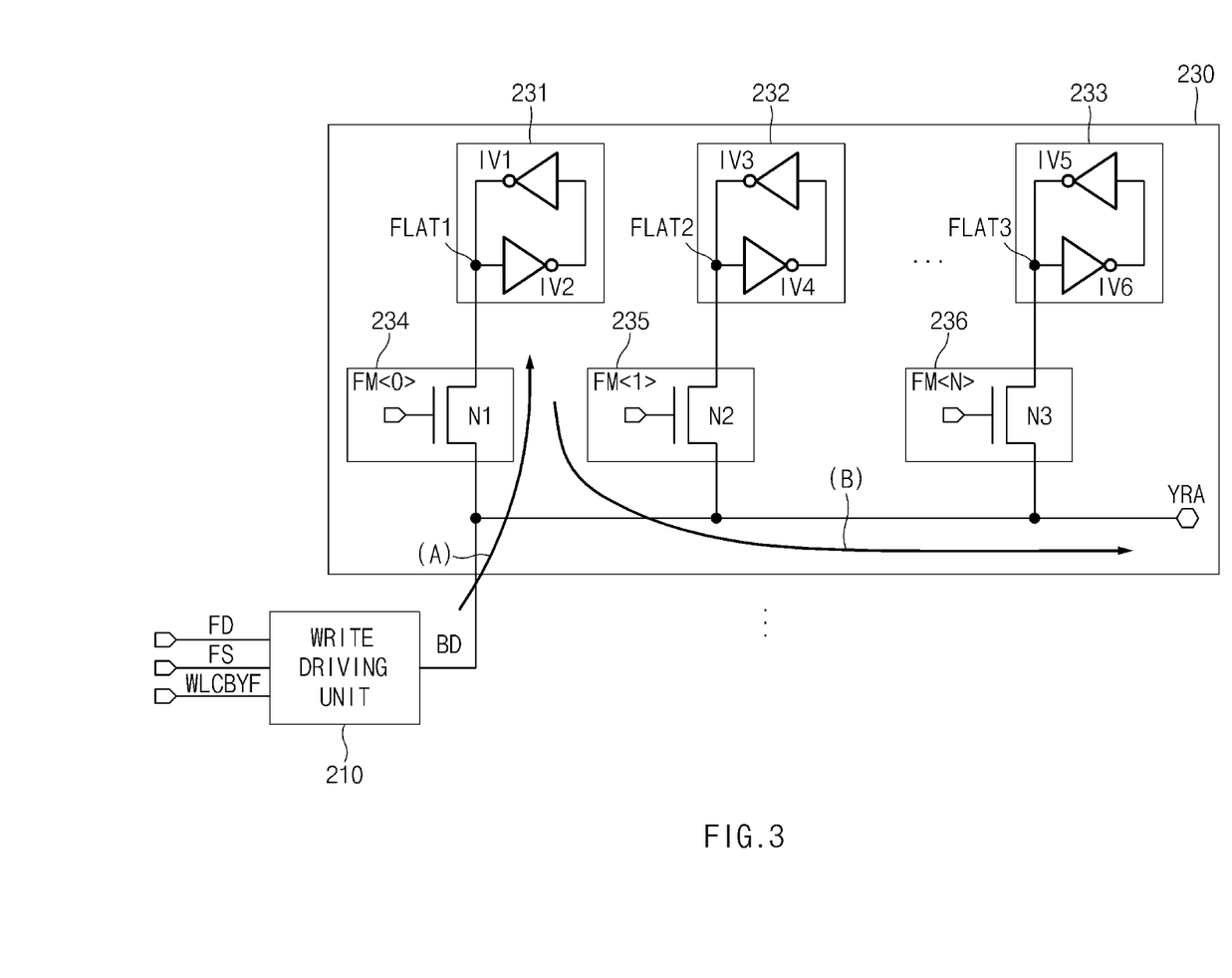
FIG. 3 is a detailed circuit diagram illustrating a representation of an example of the latch set shown in FIG. 2.

Referring to FIG. 3, a detailed circuit diagram illustrating a representation of an example of the latch set shown in FIG. 2 is shown. Since the circuits of the latch sets 230 to 250 are the same, the detailed circuit of the latch set 230 will be described as an example.

The latch set 230 includes a plurality of latches 231 to 233 and a plurality of path control sections 234 to 236. The plurality of latches 231 to 233 latch the boot-up data BD applied from the write driving unit 210 through the plurality of path control sections 234 to 236. The plurality of latches 231 to 233 include inverters of a latch structure in which output terminals and input terminals are electrically coupled.

In other words, the latch 231 includes inverters IV1 and IV2 which latch the data of a node FLAT1. The latch 232 includes inverters IV3 and IV4 which latch the data of a node FLAT2. The latch 233 includes inverters IV5 and IV6 which latch the data of a node FLAT3.

The plurality of path control sections 234 to 236 selectively output the boot-up data BD applied from the write driving unit 210 to the plurality of latches 231 to 233 in correspondence to the latch select signals FM applied from the selection unit 220.

In the case where the latch select signals FM are activated to a high level, the plurality of path control sections 234 to 236 may be turned on and may store or read data in or from the plurality of latches 231 to 233.

The path control section 234 includes a switching element N1. The switching element N1 is electrically coupled between the latch 231 and the write driving unit 210 and is applied with the latch select signal FM<0> through the gate terminal. The path control section 235 includes a switching element N2. The switching element N2 is electrically coupled between the latch 232 and the write driving unit 210 and is applied with the latch select signal FM<1> through the gate terminal. In addition, the path control section 236 includes a switching element N3. The switching element N3 is electrically coupled between the latch 233 and the write driving unit 210 and is applied with the latch select signal FM<N> through the gate terminal.

More specifically, in the case where the latch select signals FM are activated, the plurality of path control sections 234 to 236 are turned on. According to this fact, the boot-up operation, in which the boot-up data BD are stored in the plurality of latches 231 to 233, is performed as indicated by the path (A).

In the normal operation such as a write or read operation, the data stored in the plurality of latches 231 to 233 are outputted as the repair column addresses YRA as indicated by the path (B). At this time, the plurality of path control sections 234 to 236 are in a turned-on state by the latch select signals FM. The fuse set select signal FS is deactivated to a low level and floats the write driving unit 210.

In this way, in the boot-up operation and the normal (read/write) operation, when latching the repair data and outputting the latched data, the same paths are used by the plurality of path control sections 234 to 236.

The data outputted from the plurality of latches 231 to 233 are outputted as the repair column addresses YRA. The repair column addresses YRA are supplied to internal circuits. The internal circuits may be circuits which use the information stored in the latch sets 230 to 250 in a semiconductor device.

For example, the internal circuits may be circuits which set the values of internal voltages to be used in the semiconductor device, by using the information stored in the latch sets 230 to 250. The internal circuits may also be circuits which repair fails in the semiconductor device.

The write driving unit 210 may transfer the fuse data FD as the boot-up data BD, as the corresponding fuse set 230 is selected in the case where the fuse set select signal FS is activated to a high level. When reset signal WLCBYF is activated, the write driving unit 210 initializes the boot-up data BD and resets the output nodes of the repair column addresses YRA.

The write driving unit 210 operates only in the boot-up operation in which the boot-up data BD are stored in the plurality of latches 231 to 233. In the normal read or write operation, the write driving unit 210 is in the floating state. While the write driving unit 210 is in the floating state, the data stored in the plurality of latches 231 to 233 are read.

Figure 4:
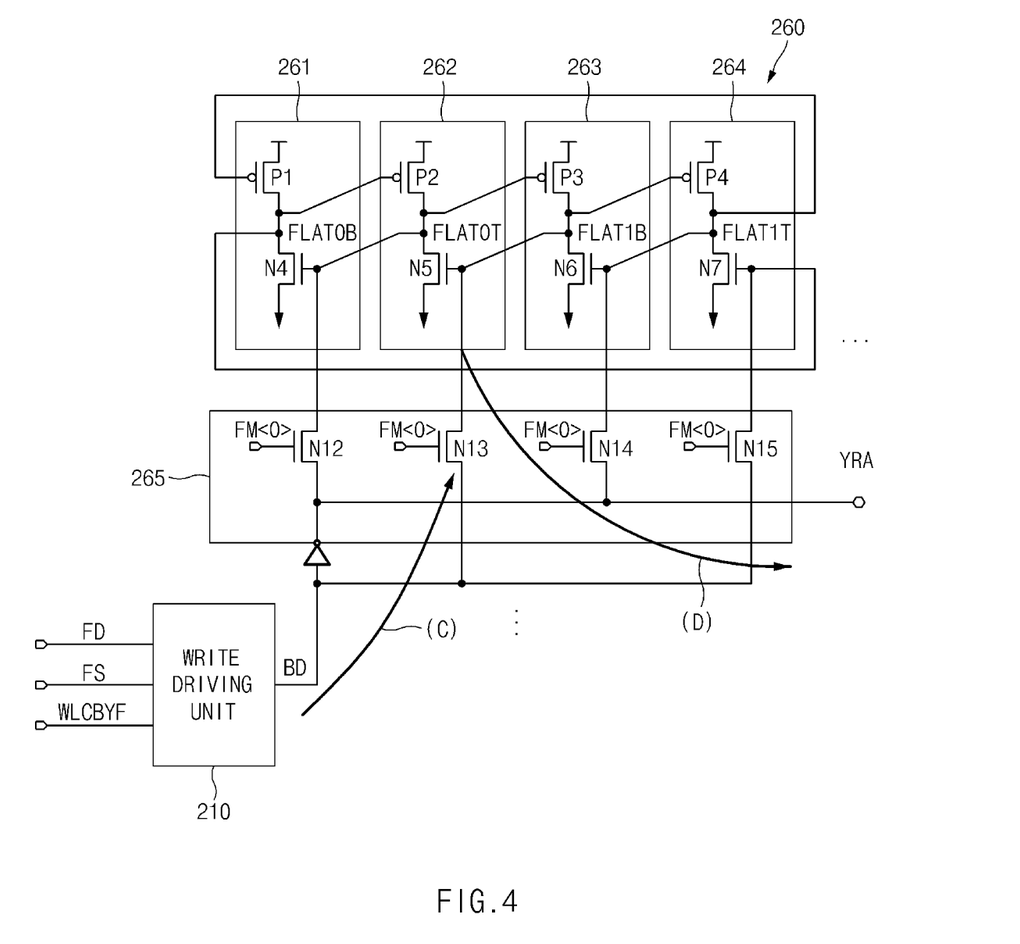
FIG. 4 is a detailed circuit diagram illustrating a representation of another example of the latch set shown in FIG. 2.

Referring to FIG. 4, a detailed circuit diagram illustrating a representation of another example of the latch set shown in FIG. 2 is illustrated.

A latch set 260 is shown in FIG. 4. Further, it is to be noted that the other latch sets 230 to 250 may be configured in the same way as the latch set 260 of FIG. 4.

The latch set 260 includes first to fourth pairs of transistors 261 to 264, and a path control section 265.

The respective first to fourth pairs of transistors 261 to 264 may include PMOS transistors P1 to P4 and NMOS transistors N4 to N7 electrically coupled in series through first to fourth storage nodes FLAT0B, FLAT0T, FLAT1B and FLAT1T corresponding to them. Each of the first to fourth storage nodes FLAT0B, FLAT0T, FLAT1B and FLAT1T may be electrically coupled to the gate of an NMOS transistor of a pair of transistors corresponding to a preceding stage and the gate of a PMOS transistor of a pair of transistors corresponding to a following stage.

For example, the second storage node FLAT0T may be electrically coupled to the NMOS transistor N4 of the first pair of transistors 261 and the PMOS transistor P3 of the third pair of transistors 263. The following stage of the fourth pair of transistors 264 may be the first pair of transistors 261. Similarly, the preceding stage of the first pair of transistors 261 may be the fourth pair of transistors 264.

The path control section 265 may transfer the boot-up data BD to the storage nodes FLAT0B, FLAT0T, FLAT1B and FLAT1T when the latch select signal FM is activated in the boot-up operation, as indicated by the path (C). The path control section 265 may read the data stored in the storage nodes FLAT0B, FLAT0T, FLAT1B and FLAT1T in the state in which the latch select signal FM is activated in the normal (read/write) operation, as indicated by the path (D).

The path control section 265 includes a plurality of switching elements N12 to N15. The switching element N12 is electrically coupled between the storage node FLAT0T and the write driving unit 210. The switching element N12 is applied with the latch select signal FM through the gate terminal thereof. The switching element N13 is electrically coupled between the storage node FLAT1B and the write driving unit 210. Further, the switching element N13 is applied with the latch select signal FM through the gate terminal thereof. The switching element N14 is electrically coupled between the storage node FLAT1T and the write driving unit 210. In addition, the switching element N14 is applied with the latch select signal FM through the gate terminal thereof. The switching element N15 is electrically coupled between the storage node FLAT0B and the write driving unit 210. Further, the switching element N15 is applied with the latch select signal FM through the gate terminal thereof.

The path control section 265 may transfer the boot-up data BD as they are, to the odd-numbered storage nodes FLAT0B and FLAT1B. In addition, the path control section 265 may transfer the inverted data of the boot-up data BD to the even-numbered storage nodes FLAT0T and FLAT1T. This is because the polarities of the odd-numbered storage nodes FLAT0B and FLAT1B and the even-numbered storage nodes FLAT0T and FLAT1T are opposite to each other.

While it is illustrated that the path control section 265 transfers the boot-up data BD to all the storage nodes FLAT0B, FLAT0T, FLAT1B and FLAT1T when the latch select signal FM is activated, this is optional. Further, it is sufficient that the path control section 265 transfers the boot-up data BD to at least two nodes of the storage nodes FLAT0B, FLAT0T, FLAT1B and FLAT1T (wherein at least two nodes may include two even-numbered nodes or two odd-numbered nodes).

The data of the storage node FLAT0B among the storage nodes FLAT0B, FLAT0T, FLAT1B and FLAT1T may be provided as an output YRA of the latch set 260. While it is illustrated that the data of the storage node FLAT0B are provided as the output of the latch set 260, it is the matter of course that even the data of any node among the storage nodes FLAT0B, FLAT0T, FLAT1B and FLAT1T may be provided as the output of the latch set 260.

While it is illustrated in FIG. 4 that the latch set 260 includes the four pairs of transistors 261 to 264 and the four storage nodes FLAT0B, FLAT0T, FLAT1B and FLAT1T, it is to be noted that the latch set 260 may be configured to include N (N is an even number of 4 or over) number of pairs of transistors and N number of storage nodes. In the case where DICE cells are applied to a latch circuit as in an embodiment shown in FIG. 4, a structure invulnerable to SER (soft error rate) may be accomplished accordingly.

Figure 5:
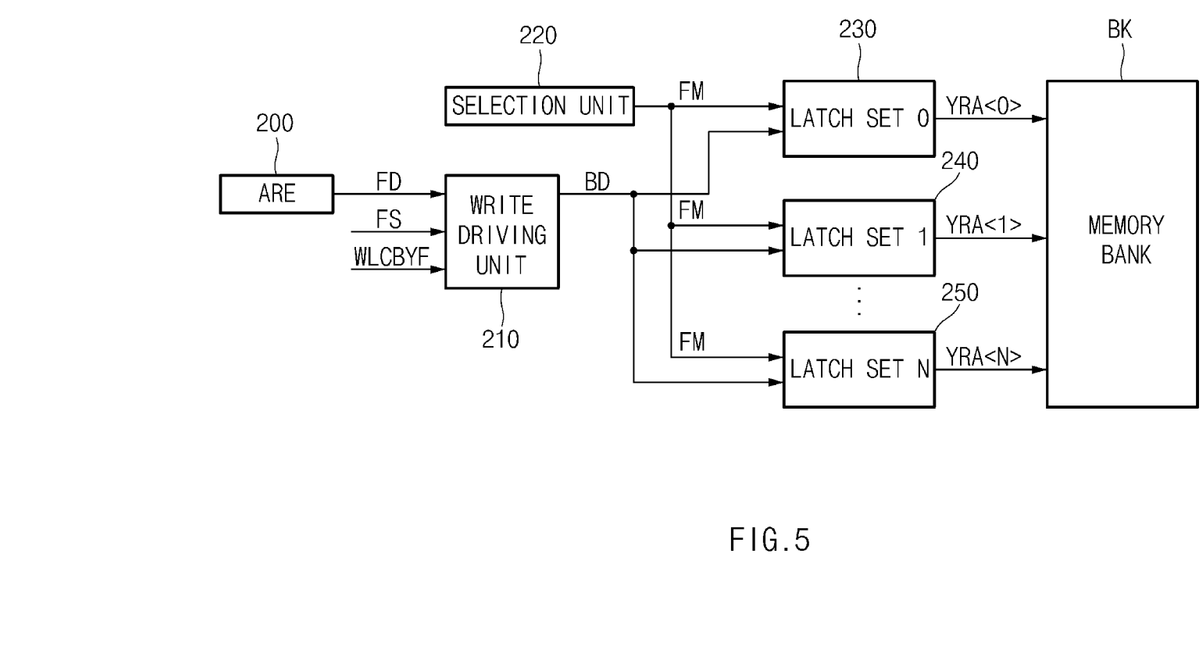
FIG. 5 is a configuration diagram illustrating a representation of an example of a semiconductor device including a latch circuit in accordance with an embodiment.

Referring to FIG. 5, a configuration diagram illustrating a representation of an example of a semiconductor device including a latch circuit in accordance with an embodiment is shown. An embodiment illustrated in FIG. 5 shows the case where the latch circuit of FIG. 2 is applied to a semiconductor device.

In FIG. 5, a semiconductor device includes an array E-fuse circuit 200, a write driving unit 210, a selection unit 220, and a plurality of latch sets 230 to 250 to store the repair information of a memory bank BK.

The memory bank BK may include a cell array and circuits to read and write data from and to the cell array. The memory bank BK may perform a repair operation to replace failed cells in the cell array with redundancy cells by using the repair column addresses YRA outputted from the latch sets 230 to 250.

While only one memory bank BK is illustrated in FIG. 5, it is to be noted that a plurality of memory banks may be provided in a memory device. For example, in the case where the number of latch sets 230 to 250 is 1280 (N=1280), four memory banks may be provided in a memory device and each of the four memory banks may perform the repair operation by using the information stored in 320 latch sets.

Figure 6:
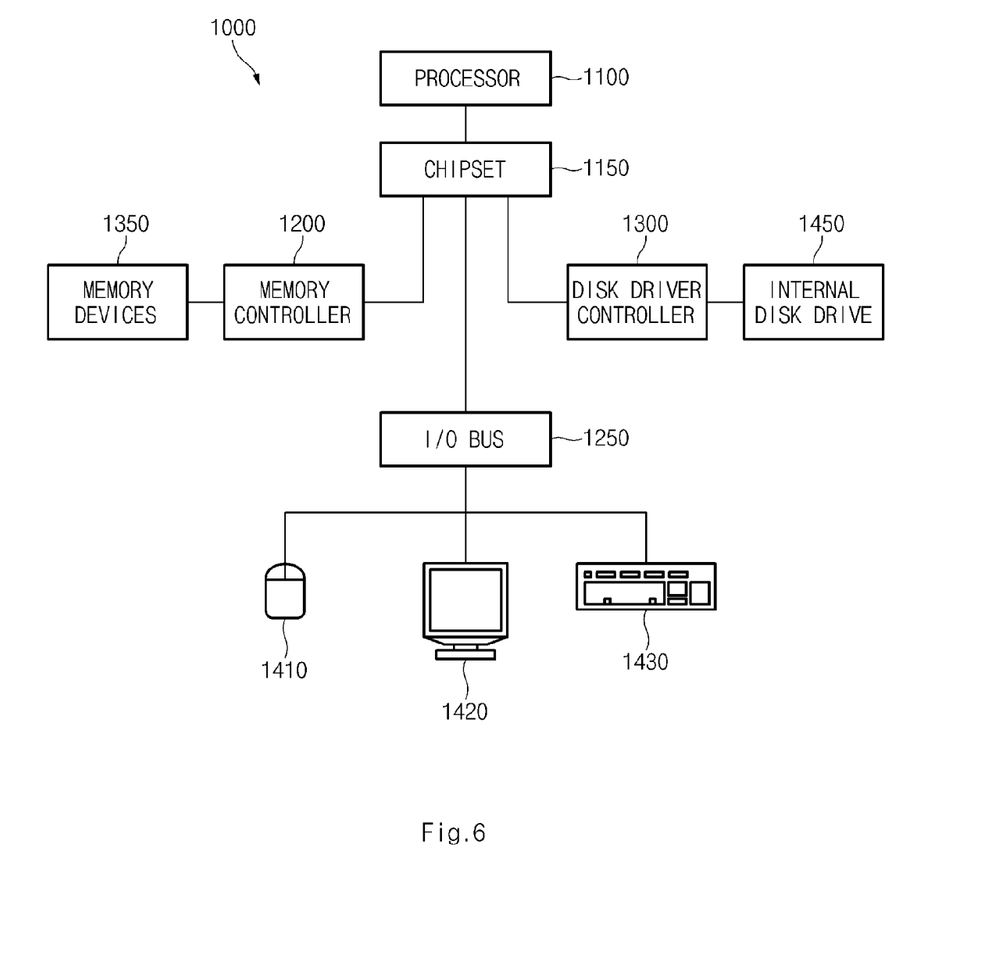
FIG. 6 illustrates a block diagram of a system employing a memory controller circuit in accordance with an embodiment of the invention.

Referring to FIG. 6, a system 1000 may include one or more processors 1100. The processor 1100 may be used individually or in combination with other processors. A chipset 1150 may be operably electrically coupled to the processor 1100. The chipset 1150 is a communication pathway for signals between the processor 1100 and other components of the system 1000. Other components of the system 1000 may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be operably electrically coupled to the chipset 1150. The memory controller 1200 can receive a request provided from the processor 1100 through the chipset 1150. The memory controller 1200 may be operably electrically coupled to one or more memory devices 1350. The memory device 1350 may include the semiconductor device described above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420 and 1430.

The disk drive controller 1300 may also be operably electrically coupled to the chipset 1150. The disk drive controller 1300 may serve as the communication pathway between the chipset 1150 and one or more internal disk drives 1450. The disk drive controller 1300 and the internal disk drives 1450 may communicate with each other or with the chipset 1150 using virtually any type of communication protocol.

As is apparent from the above descriptions, the embodiments provide advantages in that, since a path to store information and a path to read information are realized to be the same with each other, a latch structure may be simplified. Further, the area of latches may be decreased and net die efficiency may be improved.

While various embodiments have been described above, it will be understood to those skilled in the art that the various embodiments described are by way of example only. Accordingly, the latch circuit and the semiconductor device including the same described should not be limited based on the described embodiments.

What is claimed is:

1. A latch circuit comprising:
    a write driving unit configured to output fuse data as boot-up data according to a fuse set select signal in a boot-up operation;
    a latch set configured to latch the boot-up data when a latch select signal is activated in the boot-up operation, and output data latched as the latch select signal is activated as a repair column address in a normal operation; and
    a selection unit configured to generate the latch select signal,
    wherein the latch set comprises:
        a plurality of latches configured to latch the boot-up data in the boot-up operation; and
        a plurality of path control sections configured to be turned on according to the latch select signal and output the boot-up data to the plurality of latches in the boot-up operation, and be turned on according to the latch select signal and output data stored in the plurality of latches as the repair column address in the normal operation,
        wherein a same path is used by the plurality of path control sections in the boot-up operation and the normal operation.

2. The latch circuit according to claim 1, wherein the write driving unit is floated as the fuse set select signal is deactivated in the normal operation.

3. The latch circuit according to claim 1, wherein the write driving unit resets an output node of the repair column address in response to a reset signal.

4. The latch circuit according to claim 1, wherein each of the plurality of latches comprises:
    a first inverter and a second inverter of which input terminals and output terminals are electrically coupled with each other to define a latch structure.

5. The latch circuit according to claim 1, wherein the plurality of respective path control sections comprise:
    switching elements electrically coupled between the plurality of latches and an output terminal of the repair column address, and configured to be controlled by the latch select signal.

6. The latch circuit according to claim 5, wherein the switching elements comprise NMOS transistors.

7. A semiconductor device comprising:
    an array E-fuse circuit configured to store repair information;
    a latch circuit configured to output fuse data applied from the array E-fuse circuit as boot-up data according to a fuse set select signal, latch the boot-up data when a latch select signal is activated in a boot-up operation, and output data latched as the latch select signal is activated as a repair column address in a normal operation; and
    a memory bank configured to replace a normal cell with a redundancy cell by using the repair column address,
    wherein the latch circuit comprises:
    a plurality of latch sets configured to latch the boot-up data when the latch select signal is activated in the boot-up operation, and output data latched as the latch select signal is activated as the repair column address in the normal operation; and
    a selection unit configured to generate the latch select signal,
    wherein each of the latch sets comprises:
        a plurality of latches configured to latch the boot-up data in the boot-up operation; and
        a plurality of path control sections configured to be turned according to the latch select signal and output the boot-up data to the plurality of latches in the boot-up operation, and be turned on according to the latch select signal and output data stored in the plurality of latches as the repair column address in the normal operation,
        wherein a same path is used by the plurality of path control sections in the boot-up operation and the normal operation.

8. The semiconductor device according to claim 7, wherein the latch circuit further comprises:
    a write driving unit configured to output the fuse data as the boot-up data according to the fuse set select signal in the boot-up operation.

9. The semiconductor device according to claim 8, wherein the write driving unit is floated as the fuse set select signal is deactivated in the normal operation.

10. The semiconductor device according to claim 7, wherein each of the plurality of latches comprises:
    a first inverter and a second inverter of which input terminals and output terminals are electrically coupled with each other in a latch structure.

11. The semiconductor device according to claim 7, wherein the plurality of respective path control sections comprise:
   switching elements electrically coupled between the plurality of latches and an output terminal of the repair column address, and configured to be controlled by the latch select signal.

12. The semiconductor device according to claim 11, wherein the switching elements comprise NMOS transistors.

13. The semiconductor device according to claim 7, wherein each of the plurality of latch sets comprises:
   first to $N^{th}$ (wherein N is an even number greater than or equal to 4) storage nodes; and
   first to $N^{th}$ pairs of transistors,
      wherein the respective first to $N^{th}$ pairs of transistors comprise PMOS transistors and NMOS transistors electrically coupled in series through the first to $N^{th}$ storage nodes corresponding to them, and wherein each of the first to $N^{th}$ storage nodes are electrically coupled to a gate of an NMOS transistor of a pair of transistors corresponding to a preceding stage and a gate of a PMOS transistor of a pair of transistors corresponding to a following stage.

14. The semiconductor device according to claim 13, wherein each of the plurality of latch sets further comprise:
   a path control section configured to transfer the boot-up data to the first to $N^{th}$ storage nodes and transfer data stored in the first to $N^{th}$ storage nodes to the output terminal of the repair column address in response to the latch select signal.

15. The semiconductor device according to claim 14, wherein the path control section transfers the boot-up data to odd-numbered storage nodes, and transfers inverted data of the boot-up data to even-numbered storage nodes.

16. The semiconductor device according to claim 7, wherein the latch circuit resets an output node of the repair column address according to a reset signal.

* * * * *